United States Patent [19]

Molitor et al.

[11] Patent Number: 5,089,727

[45] Date of Patent: Feb. 18, 1992

[54] PULSED DRIVER CIRCUIT

[75] Inventors: Lawrence H. Molitor, Mesa; Edward J. Stearns, Scottsdale, both of Ariz.

[73] Assignee: Motorola, Inc., Schaumburg, Ill.

[21] Appl. No.: 502,706

[22] Filed: Apr. 2, 1990

[51] Int. Cl.$^5$ ............................................. H03K 17/60
[52] U.S. Cl. ..................... 307/570; 307/108; 307/265; 307/631; 328/67; 356/5; 372/25; 372/38
[58] Field of Search ............... 372/25, 26, 38; 307/630, 631, 570, 265, 266; 328/67, 186; 356/5, 28, 28.5

[56] References Cited

U.S. PATENT DOCUMENTS

| | | | |
|---|---|---|---|
| 4,266,148 | 5/1981 | Wickson | 307/252 J |
| 4,370,597 | 1/1983 | Weiner et al. | 315/58 |
| 4,398,156 | 8/1983 | Aaland | 328/233 |
| 4,633,096 | 12/1986 | Podell | 307/268 |
| 4,651,021 | 3/1987 | Hawkey | 307/106 |
| 4,733,106 | 3/1988 | Okutsu et al. | 307/270 |
| 4,845,391 | 7/1989 | Gukczynski | 370/631 |
| 4,849,644 | 7/1989 | Mira et al. | 250/561 |
| 4,888,477 | 12/1989 | Nankivil | 250/201 |
| 4,940,906 | 7/1990 | Gulczynski | 307/296.1 |
| 4,948,994 | 8/1990 | Akioka et al. | 307/570 |

OTHER PUBLICATIONS

"Laser driving and Control" Electrochemical Publication, 1981 pp. 48-58.

Primary Examiner—Frank Gonzalez
Assistant Examiner—Galen J. Hansen
Attorney, Agent, or Firm—Robert M. Handy; Maurice J. Jones

[57] ABSTRACT

A modulator circuit provides pulses of electrical energy to an electrical load in response to a trigger signal. A normally nonconductive Mosfet is included in a series circuit path with the electrical load and a capacitor. A silicon controlled rectifier (SCR) is coupled to the gate electrode of the MOSFET. A trigger signal renders the SCR conductive to thereby render the MOSFET conductive which discharges the capacitor through the electrical load to provide a pulse of electrical energy having a rapid rise time to the electrical load. The electrical load can be a laser diode which emits a pulse of light for use in an optical ranging device in response to the pulse of electrical energy. The accuracy of the ranging device is proportional to the rise time of the pulse of light.

11 Claims, 3 Drawing Sheets

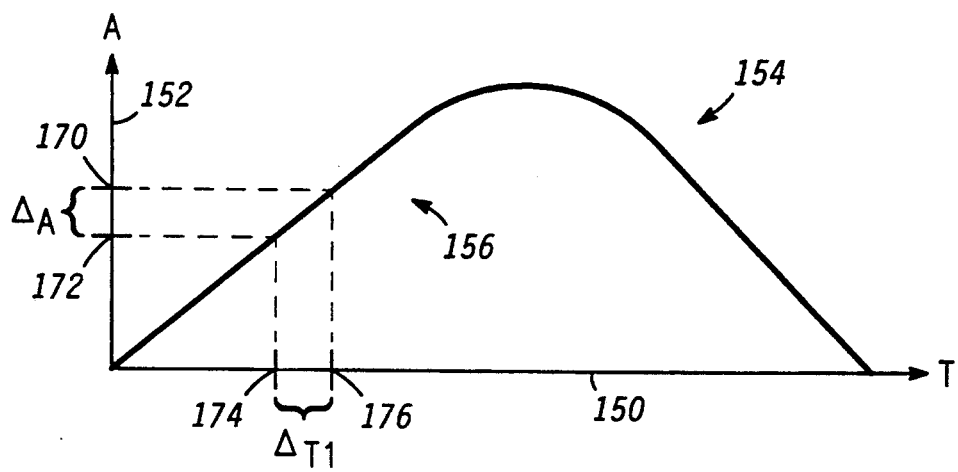
FIG. 4A
FIG. 4B
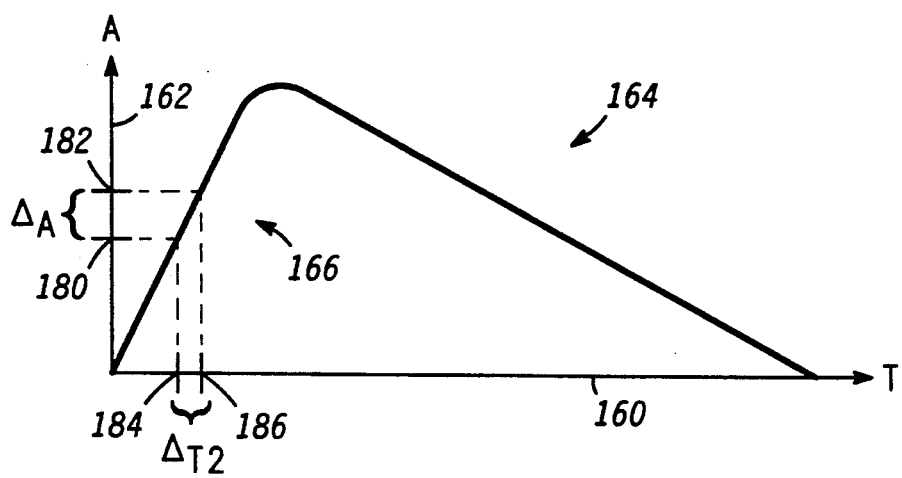

PULSED DRIVER CIRCUIT

BACKGROUND OF THE INVENTION

The present invention relates, in general, to driver circuits and, in particular, to modulation circuits for laser diodes.

Laser diodes are presently employed in optical radar systems, for instance, which determine the range or distance between the laser diode and an object of interest. Modulator circuits selectively turn such diodes on and off. A prior art modulator circuit employs a silicon controlled rectifier (SCR) connected with the laser diode and a capacitor. Control or trigger signals are applied to the gate of the SCR to render the SCR conductive to thereby discharge the capacitor through the laser diode to provide a transmitted light pulse.

The foregoing prior art circuit is useful for many applications wherein the rise time of the emitted light pulse is not critical. Rise time of a pulse can be defined as the time it takes for the amplitude of the pulse to go from 10% to 90% of its peak magnitude, for instance. Typically the fastest light pulse rise times for prior art SCR circuits is approximately 10 nanoseconds. Such circuits are useful for measuring ranges of from 80 to 90 feet, for instance. The accuracy of such ranging devices is proportional to the rise time of the emitted pulse of light. Laser diode radars for measuring ranges from 30 to 40 feet, however, require light pulses having approximately 3 nanosecond rise times. Prior art circuits for providing driving signals for enabling these faster rise times generally include a printed wiring board having numerous passive and active components located thereon. Such circuits are too expensive, unreliable and large for many applications requiring inexpensive, reliable, miniaturized circuitry.

SUMMARY OF THE INVENTION

Accordingly, it is an object of the present invention to provide inexpensive, compact and reliable modulator circuits which are suitable for providing driving signals having fast rise times.

In one embodiment, the invention relates to a modulator circuit for providing pulses of electrical energy to an electrical load in response to a trigger signal. The modulator circuit includes a capacitor for storing an electrical charge. A normally nonconductive MOSFET is included in a series circuit path with the electrical load and the capacitor. A thyristor is coupled to the gate electrode of the MOSFET. The trigger signal is supplied to and renders the thyristor conductive which causes the metal oxide semiconductor field effect transistor (MOSFET) to also become conductive. The MOSFET then rapidly discharges the capacitor through the electrical load to provide a pulse of electrical energy having a rapid rise time to the electrical load. The electrical load can be a laser diode which emits a pulse of light in response to the pulse of electrical energy for use in an optical ranging device. The accuracy of the ranging device is a function of the rise time of the light pulse.

The above and other objects of the present invention will be better understood from the following detailed description taken in conjunction with the accompanying drawings.

BRIEF DESCRIPTION OF THE DRAWINGS

FIG. 4a and 4b show waveforms illustrating the effect on the accuracy of a radar range finder of the rise times of reflected light pulses having unequal rise times.

DETAILED DESCRIPTION OF A PREFERRED EMBODIMENT

Figure 1:
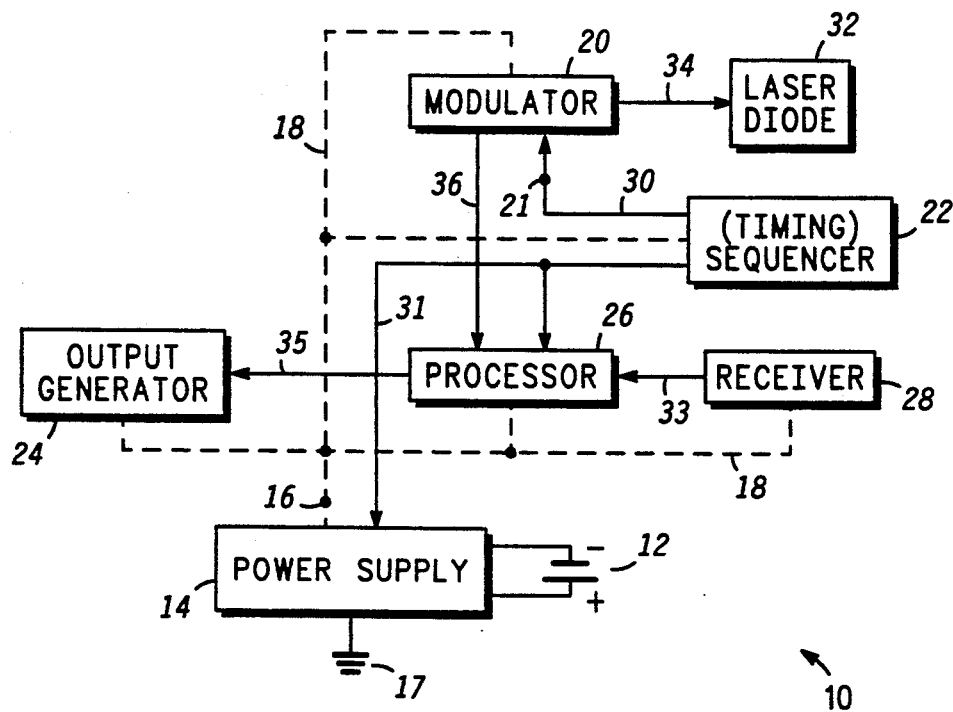
FIG. 1 is a block diagram of a typical, optical range finder.

FIG. 1 is the block diagram of an optical proximity sensor 10 for a double aperture projectile fuze carried by a projectile. Sensor 10, however, is useful for range finding applications other than for fuzes. Sensor 10 includes a battery 12 which is coupled to switching power supply 14. Power supply output terminal 16 is coupled through dashed power conductor 18 to laser modulator 20, timing sequencer 22, output generator 24, processor 26 and receiver 28. Dashed power supply conductor 18 is shown as a single dashed line for simplicity but conductor 18 represents several power supply conductors providing voltages of various magnitudes for operating sensor 10. Power supply output terminal 17 provides a ground output. Timing sequencer 22 is electrically connected through conductor 30 to control terminal 21 of modulator 20 and through conductor 31 to processor 26 and power supply 14. Laser diode 32 is coupled to the output of modulator 20 by conductor 34. Receiver 28 is connected to processor 26 through conductor 33 and processor 26 is connected to output generator 24 through conductor 35. Modulator 20 is connected through conductor 36 to processor 26.

DC-to-DC power supply 14 changes the fixed voltage of battery 12 to several plus and minus voltages for operating sensor 10. An inverter circuit operating at a particular frequency may be included in power supply 14 which results in a generation of ripple signals between terminals 16 and 17, for instance. Timing sequencer 22 performs central control for sensor 10 such as operating modulator 20 so that the pulses of light emitted by laser diode 32 and reflected back to receiver 28 are not interfered with by the ripple signals created by power supply 14, for instance.

Processor 26 typically includes a counter which initiates counting when the laser diode light pulse is transmitted and terminates counting when the received light pulse is returned so that the range of the target can be calculated. The number of counts is proportional to the range between the object of interest and sensor 10. The output of processor 26 is coupled to output generator 24 so that a charge can be ignited, for instance, when the sensor comes within a predetermined range, eg. 30 to 40 feet, of a target. Generally it is desired for sensor 10 to be about 10% accurate at approximately 30 feet. When measuring such short ranges, there is only about a 60 to 80 nanosecond delay between when the pulse is sent out by diode 32 and when the return pulse arrives back at receiver 28. Therefore, as will be explained in further detail, it is desirable to have a very rapid leading edge on the pulse of light transmitted by diode 32. It is also important that the light pulse width be short and that diode 32 provide a high energy light pulse so that the range of the sensor can be extended if desired. Processor circuitry 26 must take into account drifts in the amplitude of the received pulse due to temperature and/or because of target reflectivity, for instance. Sensor 10 is called a twin aperture optical proximity sensor because it has separate optics for laser diode 32 and receiver 28. Laser diode 32 emits a beam of light having a very narrow bandwidth with most of its energy at a single frequency.

Figure 2:
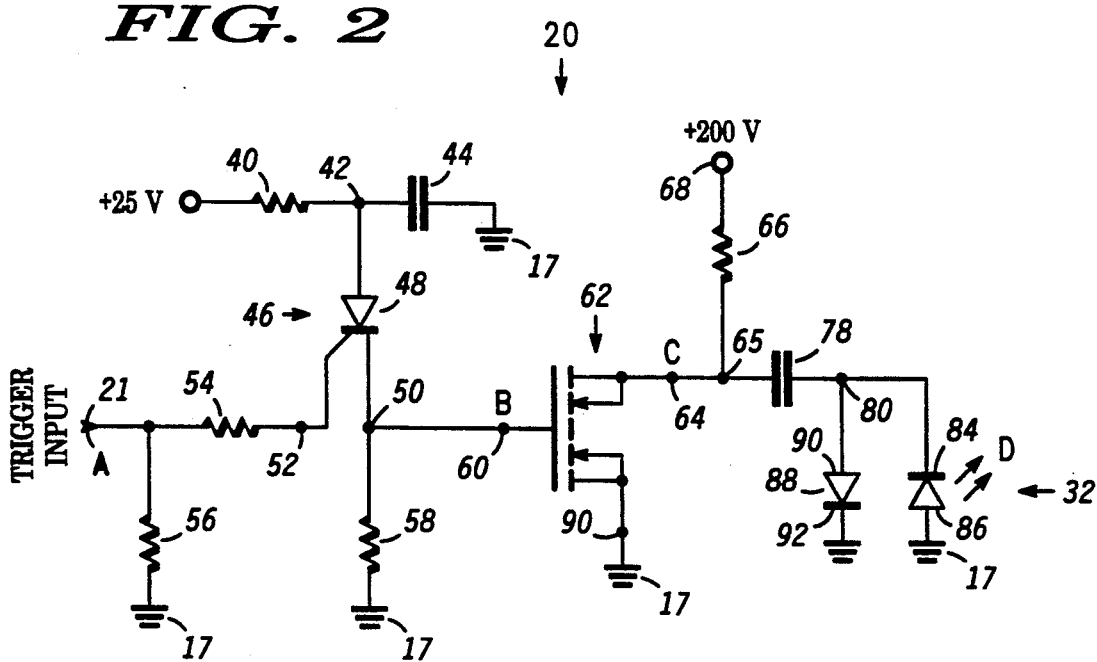
FIG. 2 is a schematic diagram of a laser diode modulator circuit employing the present invention.

FIG. 2 shows modulator 20 of FIG. 1 in schematic form. A charging resistor 40 is connected between a power supply conductor providing 25 volts and node 42. Capacitor 44 is connected between node 42 and ground conductor 17. A thyristor which can be an SCR 46 including an anode electrode 48, a cathode electrode 50 and a gate electrode 52. Anode 48 is connected to node 42. SCR 46 is a critical component in modulator 20 and must be selected for fast turn on and low conductive or "on" resistance.

Current limiting resistor 54 is connected between trigger input terminal 21 of modulator 20 and gate electrode 52. Impedance matching resistor 56 is connected between trigger input terminal 21 and ground conductor 17. SCR cathode 50 is connected through load resistor 58 to ground conductor 17 and to the gate electrode 60 of MOSFET 62. Drain electrode 64 of MOSFET 62 is connected to node 65. Charging resistor 66 is connected between a 200 volt supply conductor 68 and node 65. Capacitor 78 is connected between node 65 and node 80. Laser diode 32 includes a cathode electrode 84 which is connected to a node 80 and an anode 86 which is connected to ground conductor 17. Protection diode 88 includes an anode 90 connected to node 80 and a cathode 92 connected to ground conductor 17. MOSFET source electrode 90 is connected to ground conductor 17.

Figure 3:
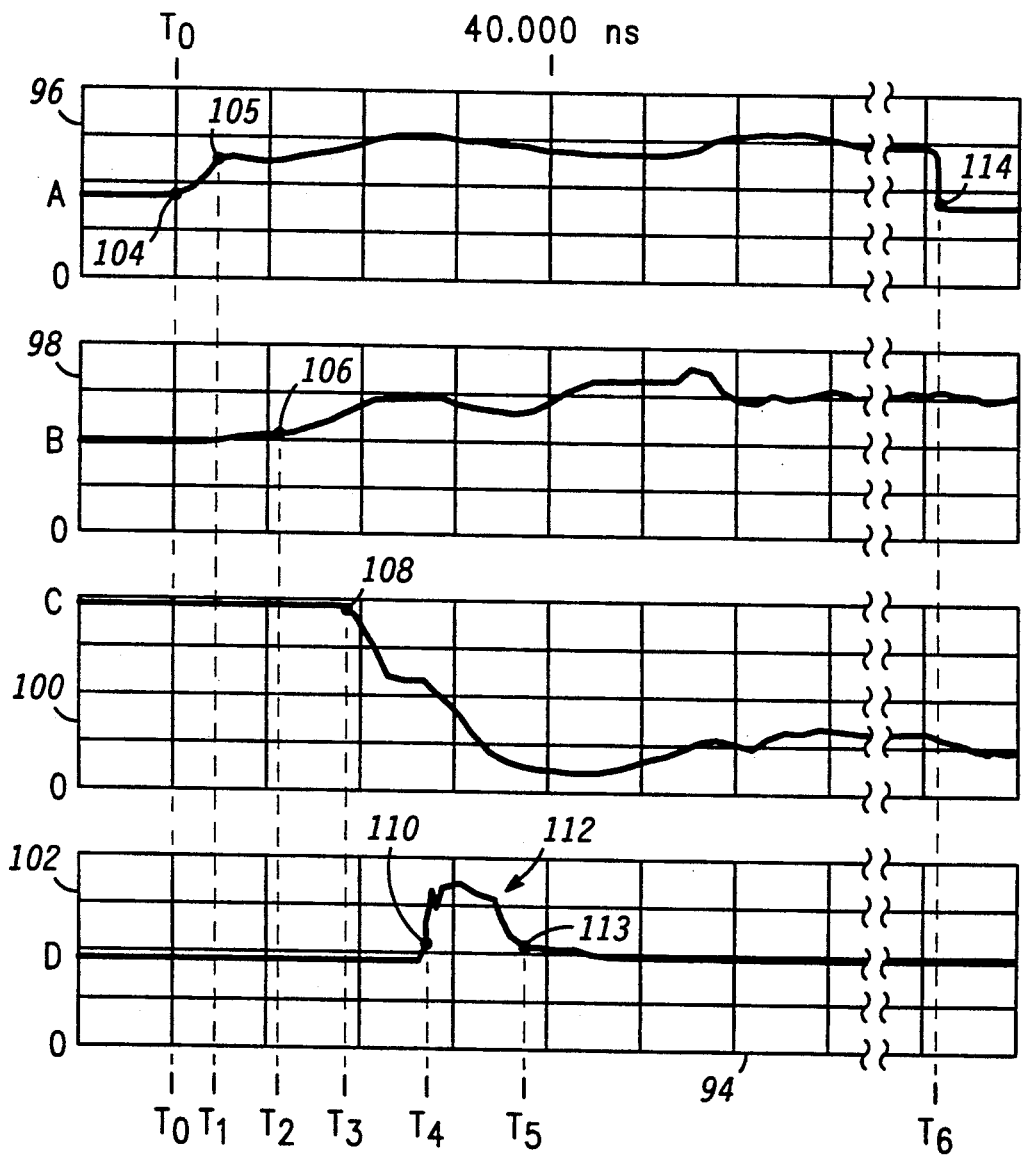
FIG. 3 illustrates the relationship between various waveforms for the circuit of FIG. 2.

FIG. 3 illustrates waveforms at various points in the circuit of FIG. 2. Abscissa axis 94 of FIG. 3 indicates time whereas amplitudes are generally indicated along ordinate axes 96, 98, 100 and 102 respectively corresponding to waveforms A, B, C and D. Specifically, waveform A represents the trigger signal at input 21 and waveform B occurs at MOSFET gate electrode 60. The MOSFET drain voltage on terminal 64 is represented by waveform C and waveform D shows the detected optical power output of the light pulse of laser diode 32. The equally spaced horizontal lines indicate amplitude divisions and the equally spaced vertical lines indicate time division along axis 96. Table 2, which follows, provides the scales for the axes of FIG. 3 for a particular embodiment including components designated in Table 1.

In operation, prior to time T0 shown on axis 94, capacitor 44 is charged from the 25 volt supply through resistor 40. Also, prior to time T0, capacitor 78 is charged from the 200 volt supply through resistor 66. Diode 88 completes the direct current (DC) return path for capacitor 78. Diode 88 protects laser diode 32 from reverse bias while capacitor 78 is being charged by clamping the voltage across laser diode 32 to about a half volt, for instance. This protects laser diode 32 from receiving too large of a reverse bias potential which could otherwise damage the laser diode. Laser diodes are typically able to only withstand about 2 or 3 volts of reverse bias.

Time T0 indicates when the magnitude of trigger input signal A begins to rise as indicated at point 104 on waveform A. The threshold of SCR 46 is crossed by trigger signal A at time T1 as indicated by point 105 on waveform A. SCR 46 then fires discharging current from capacitor 44 through resistor 58 which causes the voltage across resistor 58 to provide gate voltage B to normally nonconductive MOSFET 62.

The gate voltage of MOSFET 62 begins to rise at time T2 as indicated by point 106 on waveform B. The structure of MOSFET 62 provides a gate-to-source capacitance between electrodes 60 and 90 thereof. Gate 60 tends to provide a relatively high input capacitance as compared to some devices. MOSFET 62 has a low alternating current (AC) input impedance, which is orders of magnitude smaller than resistor 58. MOSFET 62 is selected to have a rise time of 2 or 3 nanoseconds. Specifically, gate 60 provides an AC impedance of about 0.5 ohms as compared to 50 ohms for resistor 58. MOSFET 62 is critical and must be specifically designed for pulsed operation such as the devices of the Directed Energy device family DE275, for instance.

As MOSFET 62 becomes conductive, its drain-to-source impedance and thus it drain voltage begins to drop at time T3 as indicated by point 108 on curve C of FIG. 3. Capacitor 78 is discharged through laser diode 32 by the low impedance of the drain-to-source path of MOSFET 62. The resulting current through laser diode 32 initiates at time T4 the light pulse 112 starting at point 110 on waveform D and ending at point 113 corresponding to T5. MOSFET 62 provides about a ten fold increase in the rise time of light pulse 112 as compared to using only SCR 46. Pulse 112 has a rise time of 2 or 3 nanoseconds and a pulse width of 10 nanoseconds between times T4 and T5.

The time constant of capacitor 44 and resistor 58 determines the approximate gate drive pulse width of MOSFET 62. The laser diode pulse width is determined by the capacitance of capacitor 78. Thus, the effect of the gate capacitance of MOSFET 62 is minimized by circuitry 20. The MOSFET drive pulse width of waveform B is not critical so long as it is longer than the output pulse width of light pulse 112. Capacitor 44 is selected to have a relatively large amount of capacitance to maximize the peak gate voltage of waveform B to minimize the rise time of pulse 110. The values of resistor 40 and capacitor 44 determine the recharge time for capacitor 44 which determines the maximum pulse repetition frequency (PRF) for pulse 112.

At time T6 the magnitude of trigger input signal A falls from its high level back to its low level as indicated by a point 114. Resistor 40 has high enough resistance to allow SCR 46 to return to its nonconductive state after time T6. As a result, MOSFET 62 subsequently becomes nonconductive and capacitors 44 and 78 are then recharged through respective charging resistors 40 and 46 so that a new cycle can be initiated.

Laser diode 32 operates with a very small duty cycle. For instance, the repetition rate of pulses 112 may be about 1000 cycles per second. As mentioned, the duration of pulse 112 is approximately 10 nanoseconds. This results in about a 0.001% duty cycle.

The range to an object of interest can be determined by measuring the time lapse from the leading edge of a transmitted light pulse to the leading edge of a reflected return light pulse. FIG. 4A includes an abscissa axis 150 for measuring time and an ordinate axis 152 for measuring amplitude. Light pulse 154 of FIG. 4A has a leading edge portion 156 having a relatively shallow slope which means pulse 154 has slow rise time. FIG. 4B measures time along an abscissa axis 160 and amplitude along an ordinate axis 162. Alternatively, pulse 164 of FIG. 4B has a relatively steep rise time as indicated by waveform leading edge portion 166.

Various types of targets provide different amounts of reflectivity to a received pulse. This in effect changes the amplitude of the reflected pulse. It is desirable, of course, for a ranging system to be insensitive to these changes in amplitude which are independent of range. For instance, ΔA along axis 152 indicates a change in amplitude by the differences in reflectivity of two objects at the same range. ΔA is measured between points 170 and 172 on ordinate axis 152 of FIG. 4A and results in a $\Delta T_1$ between points 174 and 176 on abscissa 150. As indicated in FIG. 4B, the same ΔA between points 180 and 182 on ordinate axis 162 results in a much smaller range error ΔT2 between points 184 and 186 on abscissa axis 160. Hence, it is necessary to maintain a fast rise time because the reflectivities of different objects at the same range tend to vary the rise time of the returning pulse. Thus, accuracy of the range measurement is proportional to the rise time of the transmitted light pulse for objects having different reflectivities or other characteristics which tend to undesirably change the amplitude of the reflected range signal.

It is apparent that circuit 20 has been provided in accordance with the invention that provides range measuring accuracy at small cost and with a small number of parts which thereby increases reliability. Also, the components of sensor 20 are suitable for being provided in a compact hybrid package.

Representative identifications and values for the main components of FIG. 2 are shown in the following Table 1.

TABLE 1

| | |
|---|---|
| Laser Diode 32 | LD40R (Laser Diode Inc.) |
| Resistor 40 | 2.2 kilohm |
| Capacitor 44 | .01 microfarad |
| Capacitor 78 | 2200 picofarad |
| SCR 46 | GA 201 (Unitrode) |
| Resistor 54 | 1 kilohm |
| Resistor 56 | 50 ohms |
| Resistor 58 | 50 ohms |
| MOSFET 62 | DE 275 501 N 12 (Directed Energy) |
| Resistor 66 | 30 kilohms |

The following Table 2 indicates the axes scales for the graphs of FIG. 3.

TABLE 2

| | |
|---|---|
| A | 10 volts per division on axis 96 |
| B | 10 volts per division on axis 98 |
| C | 40 volts per division on axis 100 |
| D | 100 millivolts per division on axis 102 |
| Timebase | 10 nanoseconds per division on axis 94 |

While the invention has been described in conjunction with a specific embodiment thereof, it is evident that many alterations, modifications and variations will be apparent to those skilled in the art in light of the foregoing description. Accordingly, the invention is intended to include all such alterations, modifications and variations in the appended claims.

We claim:

1. A modulator circuit for providing pulses of electrical energy to an electrical load in response to a trigger signal, the modulator circuit including in combination:
   first capacitive means having an electrical charge stored therein;
   normally nonconductive electron control means having first and second main electrodes and a control electrode;
   series circuit path including the electrical load, said first capacitive means and said main electrodes;
   thyristor means coupled to said control electrode of said electron control means;
   trigger signal supply means for supplying the trigger signal, said trigger signal supply means being coupled to said thyristor means; and
   said trigger signal rendering said thyristor means conductive to thereby render said electron control means conductive between said main electrodes thereof to discharge said first capacitive means through the electrical load to provide a pulse of electrical energy to the electrical load.

2. The modulator circuit of claim 1 further including:
   power conductor means; and
   resistive means coupling said power conductor means to said first capacitive means to provide said electrical charge therein.

3. The modulator circuit of claim 1 wherein said electron control means includes a MOSFET means with source, drain and gate electrodes, said MOSFET means also having a low "on" resistance on the order of one ohm between said source and drain electrodes and a fast rise time of approximately three nanoseconds, said source and drain electrodes corresponding to said main electrodes of said electron control means and said gate electrode corresponding to said control electrode of said electron control means.

4. The modulator circuit of claim 1 wherein:
   said thyristor means includes a silicon controlled rectifier having anode, cathode and gate electrodes;
   first and second power supply conductors;
   second capacitive means having an electrical charge stored therein;
   first means coupling said second capacitive means to one of said anode and cathode electrodes and to at least one of said first and second power supply conductors;
   said gate electrode of said silicon controlled rectifier being coupled to said trigger signal supply means;
   first resistive means coupling said other of said anode and cathode electrodes to said second power supply conductor, and said first resistive means also being coupled to said control electrode of said electron control means; and
   said silicon controlled rectifier being rendered conductive in response to the trigger signal to discharge said second capacitive means through said first resistive means to provide a control signal for rendering said electron control means conductive.

5. The modulator circuit of claim 4 wherein said first means includes second resistive means coupling said second capacitive means to said first power supply conductor.

6. The modulator circuit of claim 1 wherein the electrical load includes a laser diode means.

7. The modulator circuit of claim 6 further including protective diode means coupled in parallel with said laser diode means.

8. An optical range sensor having a modulator circuit for selectively providing a pulse of electrical energy having a rapid rise time to a laser diode in response to a trigger signal, the modulator including in combination:

first capacitive means having an electrical charge stored therein;

silicon controlled rectifier having anode, cathode and gate electrodes, one of said anode and cathode electrodes being coupled to said first capacitive means;

normally nonconductive MOSFET means having gate, source and drain electrodes, said gate electrode being coupled to the other of said anode and cathode electrodes of said silicon controlled rectifier;

second capacitive means having an electrical charge stored therein;

a series circuit path including the laser diode, said second capacitive means and said source and drain electrodes; and said silicon controlled rectifier being rendered conductive in response to a trigger signal to discharge said first capacitive means to provide a control signal which renders said MOSFET means conductive to discharge said second capacitive means through the laser diode to provide the pulse of electrical energy having the rapid rise time to said laser diode which provides a light pulse also having a rapid rise time.

9. The modulator of claim 8 further including charging means coupled to said first and said second capacitive means.

10. The modulator of claim 8 further including resistive means connected in series with said silicon controlled rectifier means and to said gate electrode of said MOSFET means and said resistive means providing said control signal in response to said silicon controlled rectifier being rendered conductive.

11. The modulator circuit of claim 10 wherein said MOSFET means has "on" resistance on the order of one ohm between said source and drain electrodes thereof and a fast rise time of approximately three nanoseconds.

* * * * *